United States Patent [19]

Shimura

[11] Patent Number: 5,787,124
[45] Date of Patent: Jul. 28, 1998

[54] QUADRATURE DETECTOR AND AMPLITUDE ERROR CORRECTION METHOD FOR QUADRATURE DETECTOR

[75] Inventor: Takashi Shimura, Tokyo, Japan

[73] Assignee: Advantest Corporation, Tokyo, Japan

[21] Appl. No.: 751,159

[22] Filed: Nov. 15, 1996

[30] Foreign Application Priority Data

Nov. 21, 1995 [JP] Japan ................... 7-302888

[51] Int. Cl.$^6$ ................................ G06F 7/44
[52] U.S. Cl. ................... 375/328; 375/329; 375/349; 327/63; 327/254; 327/356; 327/360; 329/306; 331/15; 331/25; 332/103
[58] Field of Search ............... 327/7, 63, 68, 327/69, 90, 231, 233, 236, 237, 238, 254, 355, 356, 360; 329/304, 306; 331/15, 18, 25; 332/103; 375/261, 279, 284, 324, 326, 328, 329, 349

[56] References Cited

U.S. PATENT DOCUMENTS

| | | |
|---|---|---|
| 4,475,088 | 10/1984 | Beard ........................... 331/25 |
| 5,150,128 | 9/1992 | Kongelbeck ................ 342/174 |
| 5,659,263 | 8/1997 | Dow et al. ................... 375/356 |

*Primary Examiner*—Don N. Vo
*Assistant Examiner*—Amanda T. Le
*Attorney, Agent, or Firm*—Oblon, Spivak, McClelland, Maier & Neustadt, P.C.

[57] ABSTRACT

A method for correcting an amplitude error between an I signal and a Q signal which are outputted from a quadrature detector including a first multiplier for multiplying a reference signal and a measured signal, a first integrator for smoothing the output of the first multiplier to generate the I signal, a 90-degree phase shifter for generating an auxiliary reference signal from the reference signal, a second multiplier for multiplying the auxiliary reference signal and the measured signal, and a second integrator for smoothing the output of the second multiplier to generate the Q signal. The method includes the step of inputting the auxiliary reference signal, instead of the reference signal, to the first multiplier to obtain a first output signal and inputting the reference signal, instead of the auxiliary reference signal, to the second integrator to obtain a second output signal. Then a correction coefficient for amplitude error correction is calculated from at least one of a ratio between the Q signal and the first output signal and a ratio between the I signal and the second output signal.

11 Claims, 2 Drawing Sheets

QUADRATURE DETECTOR AND AMPLITUDE ERROR CORRECTION METHOD FOR QUADRATURE DETECTOR

BACKGROUND OF THE INVENTION

1. Field of the Invention

The present invention relates to a quadrature detector which is used, for example, for measurement of an amplitude or a phase and for demodulation of a quadrature modulation signal. More particularly, the present invention relates to a method of correcting an amplitude error between an I signal (in-phase component signal) and a Q signal (quadrature component signal) outputted from a quadrature detector, and to a quadrature detector in which the amplitude error correction method is performed.

2. Description of the Prior Art

A quadrature detector is used not only for demodulation of a modulation signal modulated by quadrature modulation or quadrature amplitude modulation (QAM) but widely also for measurement of an amplitude or a phase of a measured signal. A quadrature detector is also known as an orthogonal detector. A basic construction of a quadrature detector is shown in FIG. 1.

The quadrature detector is provided to detect an amplitude and a phase of a measured $s_x(t)$ from a measured signal source 11 with reference to a reference signal $s_r(t)$ from a reference signal source 12 having a frequency equal to that of the measured signal source 11. The quadrature detector includes a 90-degree phase shifter ($\pi/2$ phase shifter) 13 for delaying the phase by 90 degrees, two multipliers 14 and 15, and two integrators 16 and 17 provided on the output sides of the multipliers 14 and 15, respectively. Here, reference character t denotes the time. Each of the measured signal $s_x(t)$ and the reference signal $s_r(t)$ is branched into two signals, and the measured signal $s_x(t)$ and the reference signal $s_r(t)$ are multiplied by the first multiplier 14. A multiplication output of the first multiplier 14 is smoothed by the first integrator 16 and outputted as an I signal [signal $s_I(t)$]. The second multiplier 15 multiplies the measured signal $s_x(t)$ and a signal $s_{rd}(t)$ which is supplied from the reference signal source 12 through the 90-degree phase shifter 13 and delayed by 90 degrees in phase from the reference signal $s_r(t)$, and a multiplication output of the second multiplier 15 is smoothed by the second integrator 17 and outputted as a Q signal [signal $s_Q(t)$]. The signal delayed by 90 degrees in phase from the reference signal $s_r(t)$ by the 90-degree phase shifter 13 will be hereinafter referred to as auxiliary reference signal $s_{rd}(t)$.

Where the phase of the measured signal $s_x(t)$ with respect to the reference signal $s_r(t)$ is represented by $\theta$, as the phase $\theta$ varies, the I signal exhibits a variation which increases in proportion to $\cos\theta$ while the Q signal exhibits another variation which increases in proportion to $-\sin\theta$. In particular, the I signal indicates an in-phase component of the measured signal $s_x(t)$ with the reference signal $s_r(t)$, and the Q signal indicates a quadrature component of the measured signal $s_x(t)$ to the reference signal $s_r(t)$. Thus, where the amplitudes of the I signal and the Q signal are represented by I and Q, respectively, the phase $\theta$ can be calculated from $\theta = \arctan(-Q/I)$.

By the way, in such a quadrature detector as shown in FIG. 1, it is considered that a difference in gain may be present between the first multiplier 14 and the second multiplier 15 and between the first integrator 16 and the second integrator 17. If an error is produced between the amplitudes of the I signal and the Q signal by the gain difference, then an error is produced also in a measurement value of the phase $\theta$.

Conventionally, in order to compensate for an error arising from the gain difference, output frequencies of the measured signal source 11 and the reference signal source 12 are displaced approximately by 1 kHz from each other and effective values of signals of beat components outputted from the multipliers 14 and 15 are compared with each other to measure and adjust the gain difference between the multipliers 14 and 15.

However, the method wherein output frequencies of a measured signal source and a reference signal source are displaced a little from each other and effective values of beat components of them are measured to adjust the gains has problems in that, since the gain difference between integrators cannot be measured, the amplitude error cannot be corrected completely, and in that, when the gains vary by a temperature variation or some other cause, readjustment is required.

SUMMARY OF THE INVENTION

It is a first object of the present invention to provide a method wherein an amplitude error between an I signal and a Q signal which arises from a difference in gain between devices employed in a quadrature detector can be corrected readily and with certainty.

It is a second object of the present invention to provide a quadrature detector on which the correction method can be performed.

The first object of the present invention is achieved by an amplitude error correction method for a quadrature detector which includes a first multiplier for multiplying a reference signal and a measured signal, a first integrator for smoothing an output of the first multiplier to produce an I signal and outputting the I signal, a phase shifter for generating an auxiliary reference signal having a predetermined first phase delay amount from the reference signal, a second multiplier for multiplying the auxiliary reference signal and the measured signal, and a second integrator for smoothing an output of the second multiplier to produce a Q signal and outputting the Q signal; comprising a first step of measuring at least one of the Q signal and the I signal; a second step of varying the phases of the signals to be inputted to the first multiplier and the second multiplier so that a first output signal having an in-phase or reverse phase relationship to the Q signal is outputted from the first integrator and a second output signal having an in-phase or reverse phase relationship to the I signal is outputted from the second integrator; and a third step of calculating at least one of a ratio between the Q signal and the first output signal and a ratio between the I signal and the second output signal and determining the calculated ratio as a correction coefficient to be used for amplitude error correction.

The second object of the present invention is achieved by a quadrature detector which includes a first multiplier for multiplying a reference signal and a measured signal, a first integrator for smoothing an output of the first multiplier to produce an I signal and outputting the I signal, a phase shifter for generating an auxiliary reference signal having a predetermined phase delay amount from the reference signal, a second multiplier for multiplying the auxiliary reference signal and the measured signal, and a second integrator for smoothing an output of the second multiplier to produce a Q signal and outputting the Q signal, comprising phase switching means for switching the phases of the signals to be inputted to the first multiplier and second multiplier so that a first output signal having an in-phase or reverse phase relationship to the Q signal is outputted from the first integrator and a second output signal having an in-phase or reverse phase relationship to the I signal is outputted from the second integrator.

In the present invention, in a quadrature detector which generates an I signal and a Q signal and has two output terminals for outputting the I signal and the Q signal, the phases of the signals to be inputted to multipliers in the quadrature detector are varied so that the Q signal is outputted from that one of the output terminals which is to output the I signal originally while the I signal is outputted from that one of the output terminals which is to output the Q signal originally. Then, the signals obtained when the phases are varied are compared with the original I and Q signals to determine a correction coefficient $k_g$. As a result, according to the present invention, amplitude error correction also including a gain difference between integrators in the quadrature detector can be performed, and error correction can be performed readily and with certainty.

The above and other objects, features and advantages of the present invention will become apparent from the following description referring to the accompanying drawings which illustrate examples of preferred embodiment of the present invention.

DESCRIPTION OF THE PREFERRED EMBODIMENTS

First Embodiment

Figure 1:
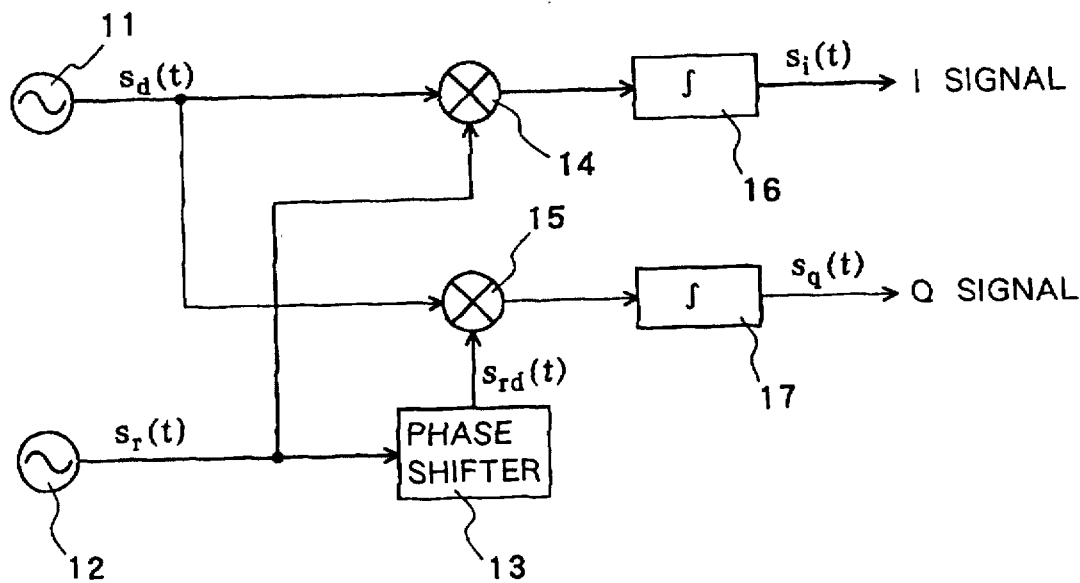
FIG. 1 is a block diagram showing a basic construction of a quadrature detector.
Figure 2:
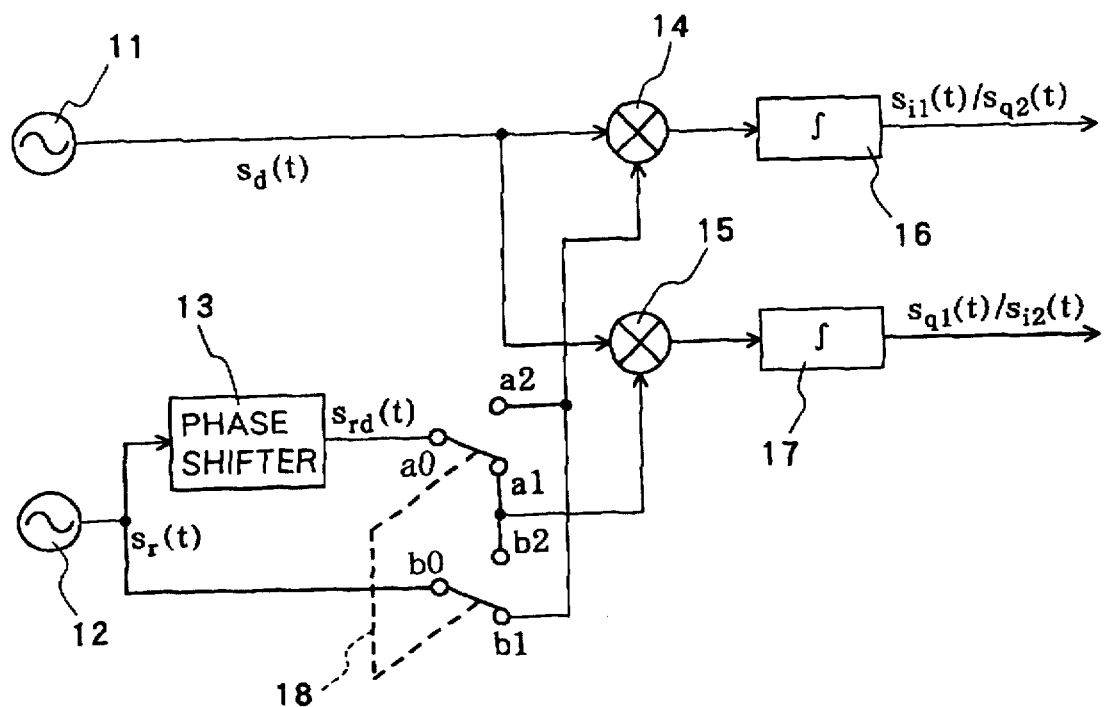
FIG. 2 is a block diagram showing a construction of a quadrature detector according to a first embodiment of the present invention.

A quadrature detector of a first embodiment of the present invention shown in FIG. 2 is constructed so as to perform amplitude error correction method of the present invention. The quadrature detector shown in FIG. 2 is a modification to and different in construction from the conventional quadrature detector shown in FIG. 1 in that it includes a switch 18 of the double pole, double throw type for switching the reference signal $s_r(t)$ and the auxiliary reference signal $s_{rd}(t)$ so that the auxiliary reference signal $s_{rd}(t)$ may be inputted to both of the multipliers 14 and 15. The auxiliary reference signal $s_{rd}(t)$ has a phase delayed by 90 degrees from the reference signal $s_r(t)$ as a result of passage thereof through the 90-degree phase shifter 13. The auxiliary reference signal $s_{rd}(t)$ branched from the reference signal source 12 through the 90-degree phase shifter 13 is supplied to a common contact a0 of a first pole of the switch 18, and the reference signal $s_r(t)$ distributed from the reference signal source 12 is supplied as it is to a common contact b0 of a second pole of the switch 18. A first contact a1 of the first pole and a second contact b2 of the second pole are connected commonly, and a signal at the common connection point is inputted to the second multiplier 15 together with the measured signal $s_d(t)$ from the signal source 11. Similarly, a second contact a2 of the first pole of the switch 18 and a first contact b1 of the second pole are connected commonly, and a signal at the common connection point is inputted to the first multiplier 14 together with the measured signal $s_d(t)$.

Since the quadrature detector is constructed in such a manner as described above, the phase difference between signals from the reference signal source side inputted to the first multiplier 14 and the second multiplier 15 can be reversed. As a result, an I signal and a Q signal can be obtained from any of the first integrator 16 and the second integrator 17. By comparing amplitude values of two I signals (or two Q signals) obtained by changing over the switch 18 to determine a gain difference, correction of the amplitude error can be performed without displacing the output frequencies of the measured signal source 11 and the reference signal source 12 from each other.

In ordinary operation, the switch 18 is set to the first contact a1, b1 side. In this state, the measured signal $s_d(t)$ and the reference signal $s_r(t)$ are multiplied by the first multiplier 14, smoothed by the first integrator 16, and then outputted as an I signal [signal $S_{i1}(t)$]. Meanwhile, the measured signal $s_d(t)$ and the auxiliary reference signal $s_{rd}(t)$ are multiplied by the second multiplier 15, and a multiplication output of the second multiplier 15 is smoothed by the second integrator 17 and outputted as a Q signal [signal $s_{q1}(t)$]. The processing procedure described above can be represented by the following equations:

$$s_d(t) = A_d \cos(\omega t + \theta_d)$$

$$s_r(t) = A_r \cos(\omega t + \theta_r)$$

$$s_{rd}(t) = A_r \cos\left(\omega t + \theta_r - \frac{\pi}{2}\right)$$

$$s_{i1}(t) = g_i \int_0^T s_d(t) \cdot s_r(t) dt = \frac{g_i A_d A_r T}{2} \cos(\theta_d - \theta_r) \quad (1)$$

$$s_{q1}(t) = g_q \int_0^T s_d(t) \cdot s_{rd}(t) dt = -\frac{g_q A_d A_r T}{2} \sin(\theta_d - \theta_r) \quad (2)$$

where $A_d$ and $A_r$ are the amplitudes of the measured signal $s_d(t)$ and the reference signal $s_r(t)$, respectively, $\omega$ is the angular frequency of the signals, and $\theta_d$ and $\theta_r$ are the initial phases of the measured signal $s_d(t)$ and reference signal $s_r(t)$, respectively. Further, $g_i$ is the combined gain of the first multiplier 14 and the first integrator 16, $g_q$ is the combined gain of the second multiplier 15 and the second integrator 17, and T is the integration time of the integrators 16 and 17 and is represented, for example, as $T=2\pi/\omega$.

Then, in order to determine a correction coefficient $k_g$ for amplitude error correction, the switch 18 is switched to the second contact a2, b2 side. As a result, the first multiplier 14 now multiplies the measured signal $s_d(t)$ and the auxiliary reference signal $s_{rd}(t)$, and the multiplication output of it is smoothed by the first integrator 16 and outputted as a Q signal [signal $s_{q2}(t)$]. Similarly, the second multiplier 15 multiplies the measured signal $s_d(t)$ and the reference signal $s_r(t)$, and the multiplication output of it is smoothed by the second integrator 17 and outputted as an I signal [signal $s_{i2}(t)$]. The processing procedure described above can be represented by the following equations:

$$s_d(t) = A_d \cos(\omega t + \theta_d)$$

$$s_{rd}(t) = A_r \cos\left(\omega t + \theta_r - \frac{\pi}{2}\right)$$

$$s_r(t) = A_r \cos(\omega t + \theta_r)$$

$$s_{q2}(t) = g_i \int_0^T s_d(t) \cdot s_{rd}(t) dt = -\frac{g_i A_d A_r T}{2} \sin(\theta_d - \theta_r) \quad (3)$$

$$s_{i2}(t) = g_q \int_0^T s_d(t) \cdot s_r(t) dt = \frac{g_q A_d A_r T}{2} \cos(\theta_d - \theta_r) \quad (4)$$

Here, the ratio between the equations (1) and (4) or between the equations (2) and (3) is given by $$k_g = \frac{s_{i1}(t)}{s_{i2}(t)} = \frac{s_{q2}(t)}{s_{q1}(t)} = \frac{g_i}{g_q}$$

and consequently, the ratio between the combined gains $g_i$ and $g_q$, that is, the correction coefficient $k_g$, can be calculated. If calculation processing of multiplying the Q signal [signal $s_{q1}(t)$] represented by the equation (2) by the correction coefficient $k_g$ is effected, then the gain difference between the combined gains $g_i$ and $g_q$ is compensated for, and the amplitude error arising from the gain difference is canceled. If the correction coefficient $k_g$ is calculated once, then it is thereafter required only to multiply the Q signal output of the second integrator 17 by the thus calculated correction coefficient $k_g$. Since the frequency of any of the measured signal source 11 and the reference signal source 12 need not be varied in the stage in which the correction coefficient $k_g$ is calculated, the number of steps required for correction is reduced remarkably comparing with the conventional method wherein a correction amount is determined based on beat components.

A result of experimental production of a quadrature detector according to the first embodiment described above is described. The combined gain $g_i$ of the first multiplier 14 and the first integrator 16 and the combined gain $g_q$ of the second multiplier 15 and the second integrator 17 had a gain difference of 0.3 dB, and if no amplitude error correction had been performed, then a phase measurement error of 1.7 degrees at the worst would be produced. Correction of an amplitude error was performed for the quadrature detector in accordance with the procedure described above, and the result of the correction revealed that the phase measurement error arising from the gain difference was removed successfully.

Second Embodiment

Figure 3:
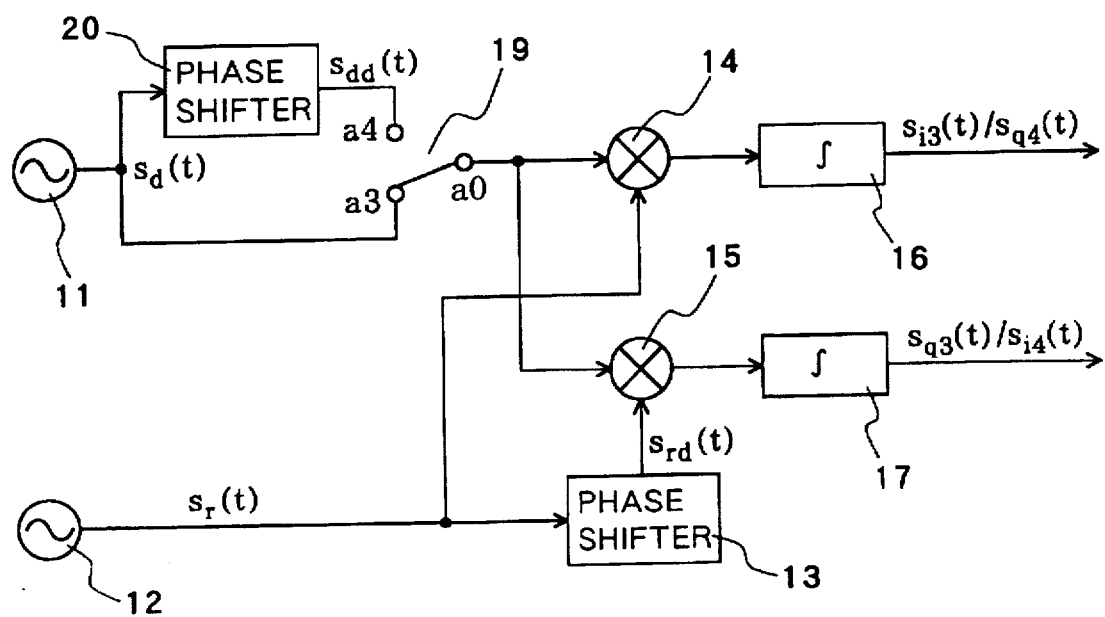
FIG. 3 is a block diagram showing a construction of a quadrature detector according to a second embodiment of the present invention.

In the present invention, the construction for allowing an I signal and a Q signal to be outputted from any of two integrators of a quadrature detector is not limited to that of the first embodiment described above. For example, a construction in which a measured signal and a signal having a phase delay of 90 degrees to the measured signal are alternatively applied to multipliers by changing over a switch may be employed. FIG. 3 shows a quadrature detector of a second embodiment of the present invention which has the construction just described.

The quadrature detector shown in FIG. 3 is a modification to and different from the conventional quadrature detector shown in FIG. 1 in that it includes, instead of supplying the measured signal $s_d(t)$ directly to the multipliers 14 and 15, a switch 19, and a 90-degree phase shifter ($\pi/2$ phase shifter) 20 for delaying the measured signal $s_d(t)$ in phase to obtain a delayed signal $s_{dd}(t)$. The measured signal $s_d(t)$ is branched into two signals, and one of the two branched signals is supplied to a first contact a3 of the switch 19 while the other branched signal is converted into the delayed signal $s_{dd}(t)$ having a phase delay of 90-degree from the measured signal $s_d(t)$, and the delayed signal $s_{dd}(t)$ is supplied to a second contact a4 of the switch 19. A common contact a0 of the switch 19 is connected to the multipliers 14 and 15.

In ordinary operation, the switch 19 is set to the first contact a3 side. In this instance, the measured signal $s_d(t)$ and the reference signal $s_r(t)$ are inputted to the first multiplier 14 while the measured signal $s_d(t)$ and the auxiliary reference signal $s_{rd}(t)$ are inputted to the second multiplier 15. Accordingly, an I signal [signal $s_{i3}(t)$] and a Q signal [signal $s_{q3}(t)$] are outputted from the first integrator 16 and the second integrator 17, respectively. The processing procedure can be represented in the following equations:

$$s_d(t) = A_d \cos(\omega t + \theta_d)$$
$$s_r(t) = A_r \cos(\omega t + \theta_r)$$
$$s_{rd}(t) = A_r \cos\left(\omega t + \theta_r - \frac{\pi}{2}\right)$$

$$s_{i3}(t) = g_i \int_0^T s_d(t) \cdot s_r(t) dt = \frac{g_i A_d A_r T}{2} \cos(\theta_d - \theta_r) \quad (5)$$

$$s_{q3}(t) = g_q \int_0^T s_d(t) \cdot s_{rd}(t) dt = -\frac{g_q A_d A_r T}{2} \sin(\theta_d - \theta_r) \quad (6)$$

Then, the switch 19 is switched to the second contact a4 side in order to determine the correction coefficient $k_g$ for amplitude error correction. As a result, the delayed signal $s_{dd}(t)$ and the reference signal $s_r(t)$ are inputted to the first multiplier 14, and the delayed signal $s_{dd}(t)$ and the auxiliary reference signal $s_{rd}(t)$ are inputted to the second multiplier 15. Since the delayed signal $s_{dd}(t)$ has a phase delay of 90-degrees from the measured signal $s_d(t)$, a Q signal [signal $s_{q4}(t)$] is outputted from the first integrator 16, and an I signal [signal $s_{i4}(t)$] is outputted from the second integrator 17. The processing procedure can be represented in the following equations:

$$s_{dd}(t) = A_d \cos\left(\omega t + \theta_d - \frac{\pi}{2}\right)$$
$$s_r(t) = A_r \cos(\omega t + \theta_r)$$
$$s_{rd}(t) = A_r \cos\left(\omega t + \theta_r - \frac{\pi}{2}\right)$$

$$s_{q4}(t) = g_i \int_0^T s_{dd}(t) \cdot s_r(t) dt = \frac{g_i A_d A_r T}{2} \sin(\theta_d - \theta_r) \quad (7)$$

$$s_{i4}(t) = g_q \int_0^T s_{dd}(t) \cdot s_{rd}(t) dt = \frac{g_q A_d A_r T}{2} \cos(\theta_d - \theta_r) \quad (8)$$

Similarly as in the first embodiment, by calculating the ratio between the equations (5) and (8) or the ratio between the equations (6) and (7), the ratio between the combined gains $g_i$ and $g_q$ is calculated, and the correction coefficient $k_g$ necessary for amplitude error correction based on the gain difference can be determined.

It is to be understood, however, that although the characteristics and advantages of the present invention have been set forth in the foregoing description, the disclosure is illustrative only, and changes may be made in the arrangement of the parts within the scope of the appended claims.

What is claimed is:

1. An amplitude error correction method for a quadrature detector which includes a first multiplier for multiplying a reference signal and a measured signal, a first integrator for smoothing an output of the first multiplier to produce an I signal and outputting the I signal, a phase shifter for generating an auxiliary reference signal having a predetermined first phase delay amount from the reference signal, a second multiplier for multiplying the auxiliary reference signal and the measured signal, and a second integrator for smoothing an output of the second multiplier to produce a Q signal and outputting the Q signal, characterized in that it comprises:

a first step of measuring at least one of the Q signal and the I signal;

a second step of varying the phases of the signals to be inputted to the first multiplier and the second multiplier so that a first output signal having an in-phase or reverse phase relationship to the Q signal is outputted from the first integrator and a second output signal having an in-phase or reverse phase relationship to the I signal is outputted from the second integrator; and a third step of calculating at least one of a ratio between the Q signal and the first output signal and a ratio between the I signal and the second output signal and determining the calculated ratio as a correction coefficient to be used for amplitude error correction.

2. The amplitude error correction method according to claim 1, wherein the first phase delay amount is 90 degrees.

3. The amplitude error correction method according to claim 1, wherein the second step is a step in which the auxiliary reference signal is inputted in place of the reference signal to the first multiplier so that the first output signal is outputted from the first integrator, and the reference signal is inputted in place of the auxiliary reference signal to the second multiplier so that the second output signal is outputted from the second integrator.

4. The amplitude error correction method according to claim 1, wherein the second step is a step in which a signal having a predetermined second phase delay amount from the measured signal is supplied in place of the measured signal to the first multiplier and the second multiplier so that the first output signal and the second output signal are outputted from the first integrator and the second integrator, respectively.

5. The amplitude error correction method according to claim 4, wherein both the predetermined first phase delay amount and the predetermined second phase delay amount are 90 degrees.

6. A quadrature detector which includes a first multiplier for multiplying a reference signal and a measured signal, a first integrator for smoothing an output of the first multiplier to produce an I signal and outputting the I signal, a phase shifter for generating an auxiliary reference signal having a predetermined phase delay amount from the reference signal, a second multiplier for multiplying the auxiliary reference signal and the measured signal, and a second integrator for smoothing an output of the second multiplier to produce a Q signal and outputting the Q signal, characterized in that it comprises:

phase switching means for switching the phases of the signals to be inputted to the first multiplier and second multiplier so that a first output signal having an in-phase or reverse phase relationship to the Q signal is outputted from the first integrator and a second output signal having an in-phase or reverse phase relationship to the I signal is outputted from the second integrator.

7. The quadrature detector according to claim 6, wherein the predetermined phase delay amount is 90 degrees.

8. A quadrature detector which includes a first multiplier for multiplying a reference signal and a measured signal, a first integrator for smoothing an output of the first multiplier to produce an I signal and outputting the I signal, a phase shifter for generating an auxiliary reference signal having a predetermined phase delay amount from the reference signal, a second multiplier for multiplying the auxiliary reference signal and the measured signal, and a second integrator for smoothing an output of the second multiplier to produce a Q signal and outputting the Q signal, characterized in that it comprises:

a switch operable, when switched, for inputting the auxiliary reference signal in place of the reference signal to the first multiplier and inputting the reference signal in place of the auxiliary reference signal to the second multiplier.

9. The quadrature detector according to claim 8, wherein the predetermined phase delay amount is 90 degrees.

10. A quadrature detector which includes a first multiplier for multiplying a reference signal and a measured signal, a first integrator for smoothing an output of the first multiplier to produce an I signal and outputting the I signal, a first phase shifter for generating an auxiliary reference signal having a first phase delay amount from the reference signal, a second multiplier for multiplying the auxiliary reference signal and the measured signal, and a second integrator for smoothing an output of the second multiplier to produce a Q signal and outputting the Q signal, characterized in that it comprises:

a second phase shifter for providing a second phase delay amount to the measured signal; and a switch operable, when switched, for inputting an output signal of the second phase shifter in place of the measured signal to the first multiplier and the second multiplier.

11. The quadrature detector according to claim 10, wherein both the first phase delay amount and the second phase delay amount are 90 degrees.

* * * * *